(12) United States Patent
Komatsuzaki (10) Patent No.: US 6,590,798 B1
(45) Date of Patent: Jul. 8, 2003

(54) APPARATUS AND METHODS FOR IMPRINT REDUCTION FOR FERROELECTRIC MEMORY CELL

(75) Inventor: Katsuo Komatsuzaki, Ibaraki (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/141,017

(22) Filed: May 8, 2002

(51) Int. Cl.[7] .............................. G11C 11/22; G11C 7/00
(52) U.S. Cl. .................. 365/145; 365/189.01; 365/207
(58) Field of Search ................................. 365/145, 149, 365/156, 189.01, 205, 207

(56) References Cited

U.S. PATENT DOCUMENTS

| | | | |
|---|---|---|---|
| 5,267,204 A | 11/1993 | Ashmore, Jr. | |
| 5,406,510 A * | 4/1995 | Mihara et al. | 365/145 |
| 5,487,032 A | 1/1996 | Mihara et al. | |
| 5,745,403 A | 4/1998 | Taylor | |
| 5,917,746 A * | 6/1999 | Seyyedy | 365/145 |
| 5,978,252 A | 11/1999 | Miwa | |
| 6,198,653 B1 * | 3/2001 | Tanaka | 365/145 |
| 6,229,730 B1 * | 5/2001 | Kato | 365/145 |
| 6,473,330 B1 * | 10/2002 | Ogiwara et al. | 365/145 |

* cited by examiner

Primary Examiner—Son T. Dinh
(74) Attorney, Agent, or Firm—Jacqueline J. Garner; W. James Brady, III; Frederick J. Telecky, Jr.

(57) ABSTRACT

Memory devices and methods are disclosed for reading a restoring data from and to ferroelectric memory cells, wherein a data bit is sensed from a data memory cell, a toggle bit is sensed from a toggle memory cell, and the sensed data bit is transferred to an IO line in either inverted form or non-inverted form according to the sensed toggle bit. The sensed data bit and the toggle bit are then inverted and restored to the data and toggle memory cells so as to mitigate or reduce cell imprint.

20 Claims, 11 Drawing Sheets

| | AFTER INITIAL WRITE | AFTER FIRST READ/RESTORE | AFTER SECOND READ/RESTORE | AFTER SECOND WRITE |
|---|---|---|---|---|
| DATA CELL 1 DATA | 1 | 1 ---> 0 | 0 ---> 1 | 1 |
| TOGGLE CELL DATA | 1 | 1 ---> 0 | 0 ---> 1 | 1 |
| DATA OUTPUT TO IO | N/A | 1 | 1 | N/A |

| | AFTER INITIAL WRITE | AFTER FIRST READ/RESTORE | AFTER SECOND READ/RESTORE | AFTER SECOND WRITE |
|---|---|---|---|---|
| DATA CELL 2 DATA | 0 | 0 ---> 1 | 1 ---> 0 | 0 |
| TOGGLE CELL DATA | 1 | 1 ---> 0 | 0 ---> 1 | 1 |
| DATA OUTPUT TO IO | N/A | 0 | 0 | N/A |

FIG. 9E

APPARATUS AND METHODS FOR IMPRINT REDUCTION FOR FERROELECTRIC MEMORY CELL

FIELD OF INVENTION

The present invention relates generally to semiconductor devices and more particularly to apparatus and methods for reducing imprint in ferroelectric memory cells.

BACKGROUND OF THE INVENTION

In semiconductor memory devices, data is read from or written to the device using address signals and various other control signals. Such memory devices are used for storage of data and/or program code in personal computer systems, embedded processor-based systems, and the like. Ferroelectric memories are commonly organized in single-transistor, single-capacitor (1T1C) or two-transistor, two-capacitor (2T2C) configurations, which are well known. The ferroelectric memory cells typically comprise one or more ferroelectric (FE) capacitors adapted to store a binary data bit, as well as one or more access transistors, typically MOS devices, operable to selectively connect the FE capacitor to one of a pair of complimentary bitlines, with the other bitline being connected to a reference voltage. The individual cells are commonly organized as individual bits of a corresponding data word, wherein the cells of a given word are accessed concurrently by activation of platelines and wordlines by address decoding circuitry.

Ferroelectric memory devices provide non-volatile data storage where data memory cells are constructed using ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field which exceeds the coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complimentary bitline and a plateline signal voltage. This provides a differential voltage on the bitline pair, which is connected to a sense amp circuit. The reference voltage is typically supplied at an intermediate voltage between the voltage associated with a capacitor charged to a binary "0" and that of the capacitor charged to a binary "1". The polarity of the sensed differential voltage thus represents the data stored in the cell, which is buffered and applied to a pair of local IO lines. The transfer of data between the ferroelectric memory cell, the sense amp circuit, and the local data bitlines is controlled by various access transistors, typically MOS devices, with switching signals being provided by control circuitry in the device.

Connection of the ferroelectric cell capacitor between the plateline and the bitline during a read operation causes an electric field to be applied to the cell capacitor. If the field is applied in a direction to switch the internal dipoles, more charge will be moved than if the dipoles are not reversed. As a result, sense amplifiers can measure the charge applied to the cell bit lines and produce either a logic "1" or "0" at the sense amp terminals. Since reading the cell data is a destructive operation, the sensed data is then restored to the cell following each read operation. To write data to the cell, an electric field is applied to the cell capacitor to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption.

However, ferroelectric memories suffer several shortcomings, which have heretofore inhibited their widespread acceptance in the marketplace. Among these are memory cell relaxation and imprint phenomena associated with the ferroelectric capacitors used in forming the memory cells. Relaxation involves partial loss of charge from the ferroelectric capacitor where a cell is unaccessed in a period shortly after a sequence of continuous cycling of the cell. Imprint is the tendency of ferroelectric capacitors to prefer one state over the other, which is found where the cell capacitor is programmed to one state for a long period of time. The hysteresis curve for an imprinted cell capacitor effectively shifts to favor the stored state due to a charge build-up. In a ferroelectric memory device, cell imprint results in a voltage offset in both the "0" state voltage and the "1" state voltage, and hence reduces the sensing margin with respect to the reference voltage to which the cell voltage is compared during a read operation.

As a result, ferroelectric cell imprint may cause an undesirably low signal level being presented to the sense amps during read operations. This, in turn, leads to the possibility of device failure during testing, or the potential provision of erroneous data during a memory device read. Thus, there is a need for improved ferroelectric memory devices and methodologies by which the adverse effects of imprint phenomena may be mitigated or reduced.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention relates to ferroelectric memory devices in which the data stored in individual ferroelectric memory cells is inverted during or following a read operation. The invention may be employed to mitigate or reduce imprint phenomena associated with ferroelectric cell capacitors in such devices. Toggle memory cells are provided for storing toggle data bits associated with data words, which indicate whether the data cell data is currently stored in an inverted state or in a non-inverted state. During a read operation, the toggle data bit information is used to selectively invert data being provided to local IO lines or to sense amp circuits if the data was stored in the inverted state. In applications where data in cells corresponding to a data word is read more frequently than it is written, the invention may reduce the adverse effects of cell capacitor imprint by reversing the programmed state of the cell capacitor each time the cell is read, even though the actual cell data has not changed. The toggle data thus provides an indication of whether sensed cell data is actual or inverted, which may be used during transfer of sensed cell data to IO lines or during sensing operation, to re-invert data as needed. Thus, the local IO lines are always provided the correct data, regardless of whether the sensed cells contained inverted or non-inverted data.

Another aspect of the invention provides methods for reading data from a ferroelectric data memory cell in a memory device, comprising sensing a data bit from a data memory cell and sensing a toggle bit from a toggle memory cell. The method further comprises selectively inverting the data bit sensed from the data memory cell according to the sensed toggle bit, and transferring the data bit to an IO line. The method may also be employed in restore operations involving inverting the data bit and transferring the inverted data bit to the data memory cell and inverting the toggle bit and transferring the inverted toggle bit to the toggle memory cell during a restore operation.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to ferroelectric memory circuits and devices, as well as methods for reading cell data thereof. The various aspects of the invention may be implemented in a variety of ways, several of which are illustrated and described below. However, it will be appreciated that the implementations illustrated and described below are exemplary in nature and that the invention is not limited to the implementations specifically illustrated and described herein.

Figure 1:
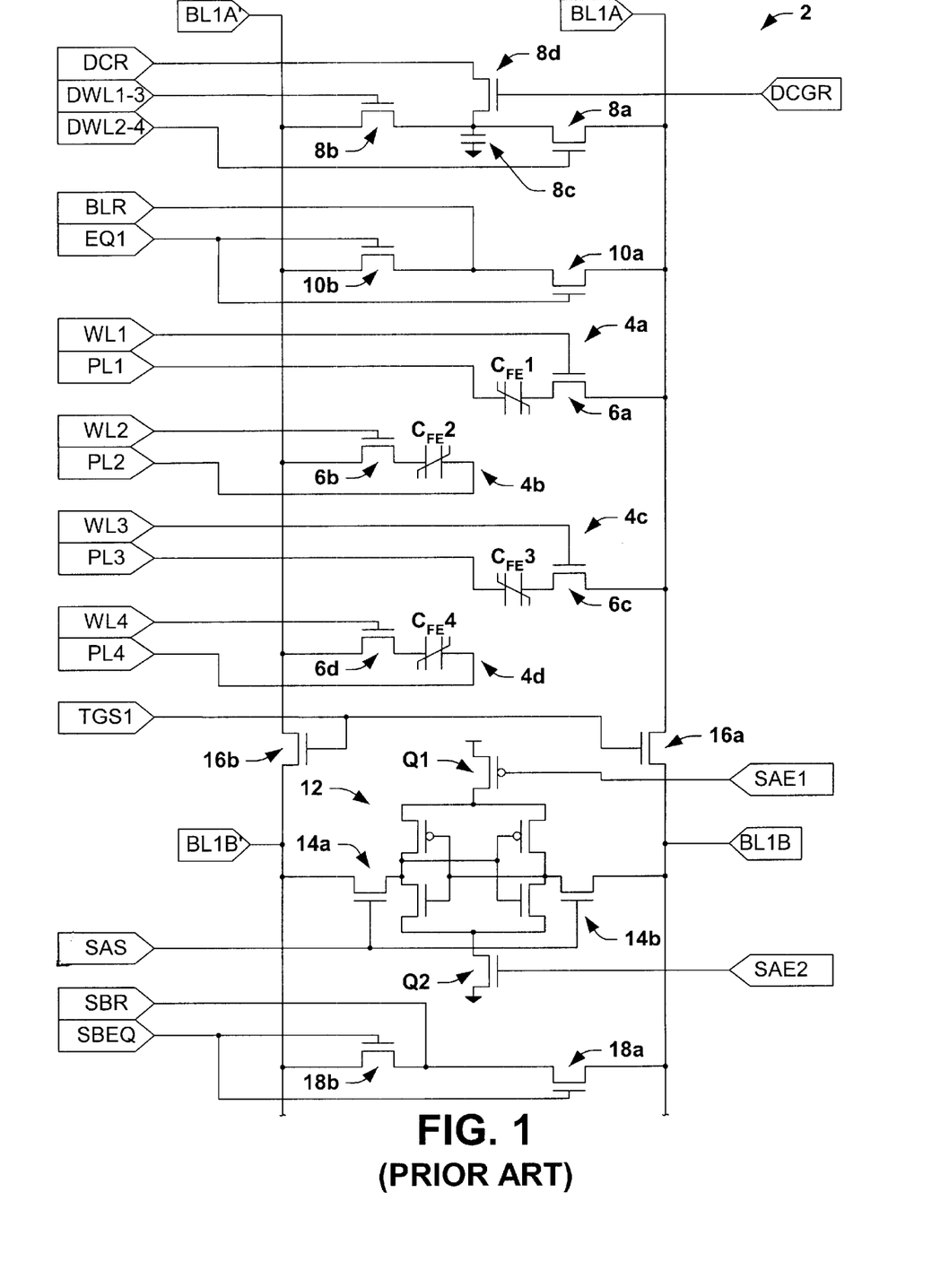
FIG. 1 is a schematic diagram illustrating a portion of a conventional ferroelectric memory device with a conventional shared sense amp connectable to a pair of complimentary bitlines.

Referring initially to FIG. 1, a portion of a conventional ferroelectric memory device 2 is illustrated including a group of four 1T1C ferroelectric (FE) memory cells 4a–4d. The cells 4a–4d include FE capacitors $C_{FE}1$–$C_{FE}4$ and MOS access transistors 6a–6d, respectively, configured in a column along a pair of complimentary bitlines BL1A and BL1A'. The cells 4a–4d and the contents thereof are accessed during read, restore, and write operations via the bitlines BL1A and BL1A' using wordline and plateline signals WL1–WL4 and PL1–PL4, respectively. The FE capacitors $C_{FE}1$ or $C_{FE}3$ may be connected to bitline BL1A via WL1 and PL1 or WL3 and PL3, respectively, and FE capacitors $C_{FE}2$ or $C_{FE}4$ may be connected to bitline BL1A' via WL2 and PL2 or WL4 and PL4, respectively. A reference voltage is applied to the other bitline using a transistor 8a or 8b and a precharged dummy cell reference capacitor 8c, which is precharged to a dummy cell reference voltage DCR using a transistor 8d. The bitlines BL1A and BL1A' may be precharged or equalized to a bitline reference voltage BLR using transistors 10a and 10b according to a signal EQ1.

The device 2 further includes a conventional sense amp circuit 12 selectively connectable to complimentary sense amp bitlines BL1B and BL1B' using sense amp select transistors 14a and 14b, respectively via a sense amp select signal SAS, and enabled using sense amp enable signals SAE1 and SAE2. The bitline pairs BL1A/BL1A' and BL1B/BL1B' are connectable to one another via transistors 16a and 16b, respectively, using a signal TGS1, whereby the sense amp 12 may be shared between many such groups of memory cells 4. During various operations of the device, the sense amp bitlines BL1B and BL1B' may be precharged or equalized to a sense bit reference voltage SBR using transistors 18a and 18b, respectively, via a sense bit equalize signal SBEQ.

During a read operation targeting cell 4a, the capacitor $C_{FE}1$ is connected to BL1A via transistor 6a and signals WL1 and PL1, while the precharged reference capacitor 8c is connected to the complimentary bitline BL1A' via the transistor 8b and the dummy wordline signals DWL1–3. This provides a reference voltage DCR to the bitline BL1A', such as about half the sum of the "0" data signal voltage plus the "1" data signal voltage (e.g., $[V_{"0"}+V_{"1"}]/2$). Similarly, where the second cell 4b is read, the capacitor $C_{FE}2$ is connected to BL1A', while the dummy cell reference capacitor 8c is connected to BL1A. The accessed cell 4 and the reference capacitor 8c create a differential voltage across BL1A and BL1A', which is transferred to the sense amp bitlines BL1B and BL1B' for sensing by the amp 12. During such access, the sense amp 12 is connected to the bitlines BL1B and BL1B' (e.g., enabled) by the transistors 14 via the signal SAS.

The FE memory device 2, however, suffers from the imprint effects discussed above. For example, where the data in the cell capacitor $C_{FE}1$ is written relatively infrequently, or where the data written thereto is predominantly one particular binary state, the performance of the capacitor $C_{FE}1$ may preferentially shift toward that state (e.g., the hysteresis curve may shift to favor the stored state due to a charge build-up), leading to voltage offsets in the "0" and "1" state voltages, thereby reducing the sensing margin with respect to the reference voltage DCR. This imprint effect may cause reduced differential level in the read signal presented to the sense amp 12, in turn, increasing the likelihood of device failure or the provision of erroneous data during a memory device read.

Figure 2:
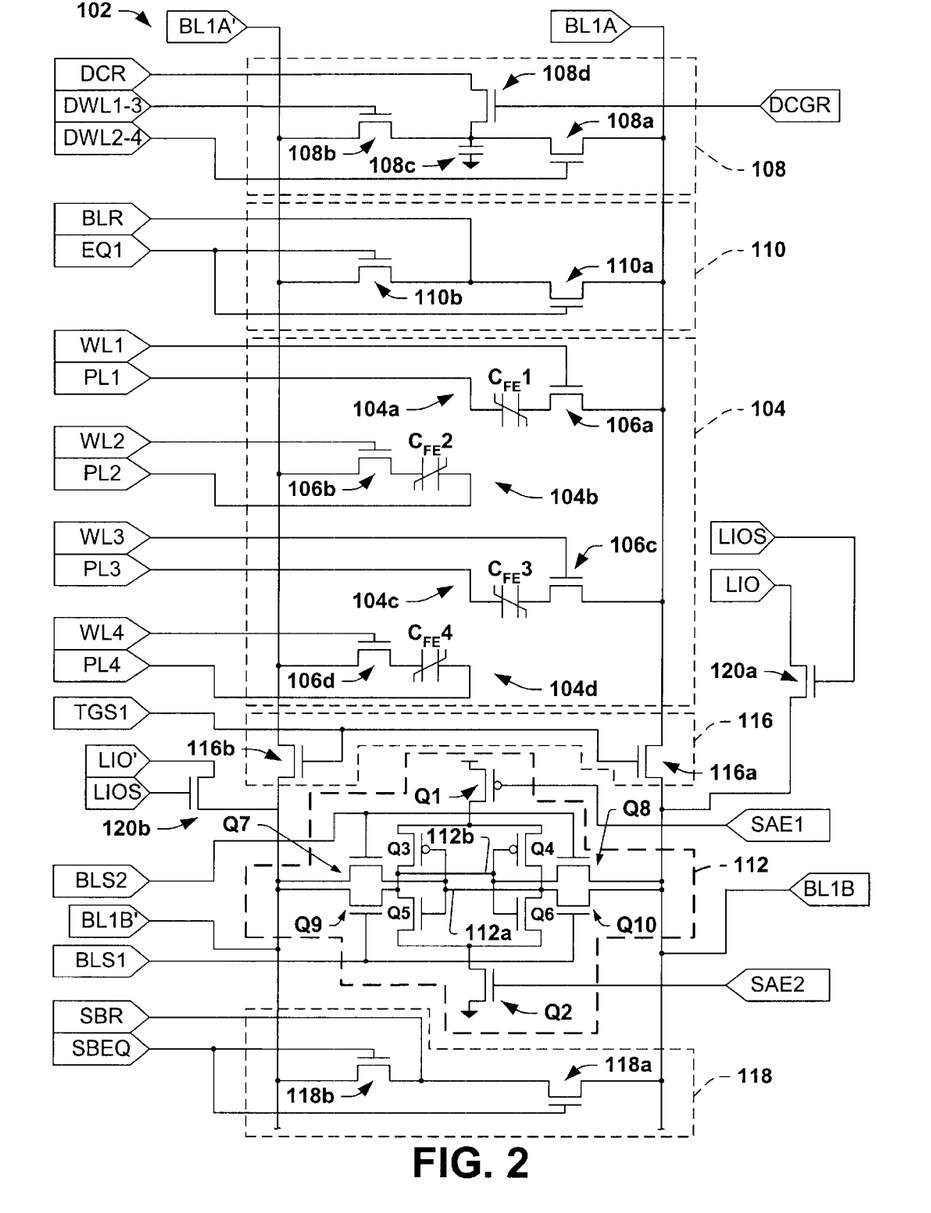
FIG. 2 is a schematic diagram illustrating a portion of an exemplary ferroelectric memory device in accordance with one or more aspects of the present invention.

Turning now to FIGS. 2–5B, the invention advantageously provides for alternating or inverting the state of the cell capacitors when a cell is read. This aspect of the invention may be employed to reduce or mitigate ferroelectric cell capacitor imprint phenomena and the adverse effects associated therewith. In FIG. 2, a portion of one column of an exemplary ferroelectric memory device 102 is illustrated, comprising a group 104 of four ferroelectric data memory cells 104a–104d organized in a 1T1C configuration. Although the exemplary device 102 is illustrated having memory cells 104 configured in 1T1C fashion, it will be appreciated that the various aspects of the present invention are not limited to 1T1C configurations, and that other configurations fall within the scope of the invention, for example, including but not limited to 2T2C organizations. Moreover, the grouping of cells 104 may comprise any number of such ferroelectric memory cells 104.

The cells 104a–104d include FE capacitors $C_{FE}1$–$C_{FE}4$ and MOS access transistors 106a–106d, respectively, configured in a column along a pair of complimentary bitlines BL1A and BL1A'. The cells 104a–104d are accessed using wordline and plateline signals WL1–WL4 and PL1–PL4, respectively, wherein one of the cells 104 is connected to one of the complimentary bitlines BL1A/BL1A' and a reference voltage is applied to the other bitline by a dummy cell reference circuit 108. The reference circuit 108 comprises transistors 108a and 108b, and a dummy cell reference capacitor 108c, which may be precharged to a dummy cell reference voltage DCR using a transistor 108d. The bitlines BL1A and BL1A' may be precharged or equalized to a bitline reference voltage BLR by a bitline equalization circuit 110 using transistors 110a and 110b according to a signal EQ1.

The device 102 further comprises a shared sense amp circuit 112 along complimentary bitlines BL1B and BL1B' connectable to the complimentary data memory cell bitlines BL1A and BL1A' via transistors 116a and 116b, respectively, using signal TGS1. The bitlines BL1B and BL1B' may be precharged or equalized to a sense bit reference voltage SBR using transistors 118a and 118b, respectively, via a sense bit equalize signal SBEQ.

Figure 3:
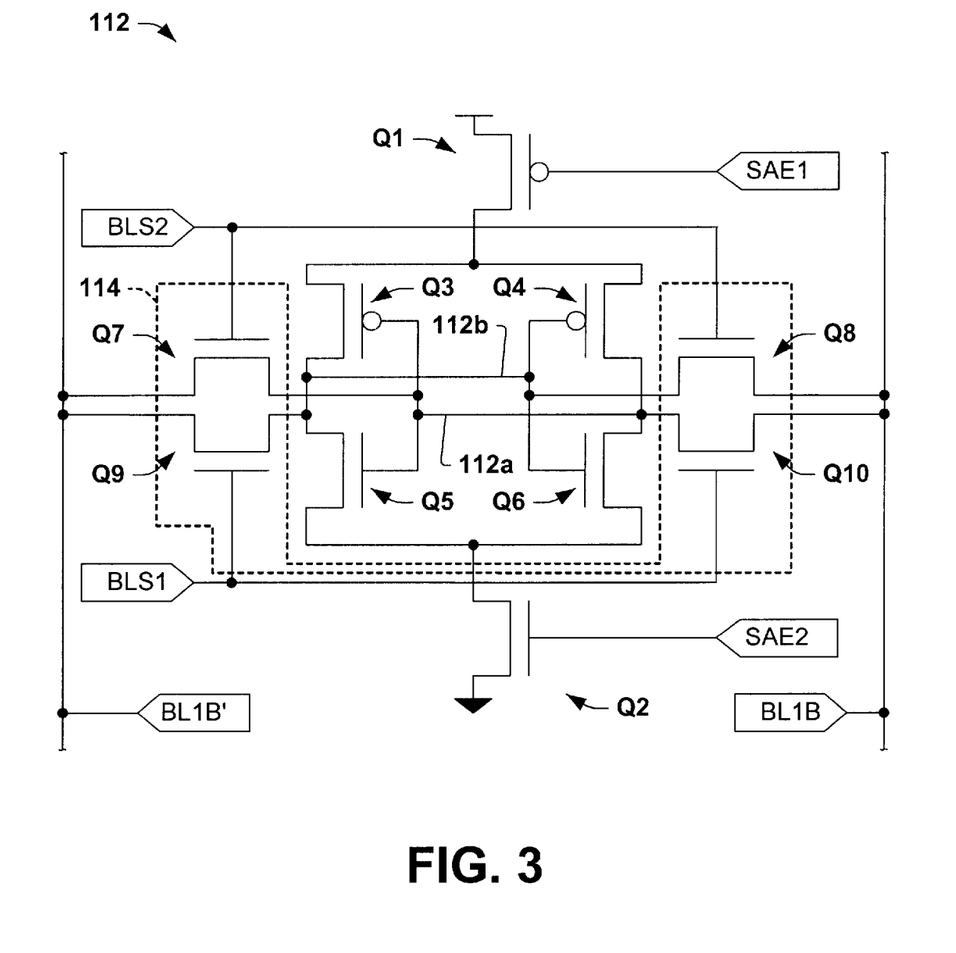
FIG. 3 is a schematic diagram illustrating an exemplary sense amp and data bitline select circuit in the memory device of FIG. 2 in accordance with the invention.

Referring also to FIG. 3, in accordance with an aspect of the invention, the data sense amp circuit 112 comprises first and second terminals 112a and 112b, which are selectively connectable to the bitlines BL1B/BL1B', and also to the data bitlines BL1A/BL1A' via the transistors 116a and 116b.

Thus, for example, to read the data cell 104a, the FE capacitor $C_{FE}1$ is connected to BL1A via the transistor 106a and signals WL1 and PL1, while the precharged reference capacitor 108c is connected to the complimentary bitline BL1A' to provide a reference voltage DCR thereto. The reference voltage DCR is between the voltages associated with "0" and "1" states of the FE capacitor $C_{FE}1$, such as about half the sum of the "0" data signal voltage plus the "1" data signal voltage (e.g., $[V_{"0"}+V_{"1"}]/2$). The cell 104a and the reference 108 create a differential voltage across BL1A and BL1A', which is transferred to the sense amp bitlines BL1B and BL1B' for sensing by the sense amp circuit 112.

The sense amp bitlines BL1B/BL1B' and the sense amp terminals 112a and 112b are initially equalized to a 0 volt sense bitline reference SBR via sense bitline equalize signal SBEQ and the data column bitlines BL1A/BL1A' are equalized to a 0 volt bitline reference BLR via equalization signal EQ1. At this point, the sense amp PMOS transistors Q3 and Q4 are on, while NMOS transistors Q5 and Q6 are off. Enabling signals SBEQ and BLS1 thus equalizes the gates of the transistors Q3, Q4, Q5, and Q6 to 0 volts. Upon connection of the data bitlines BL1A/BL1A' with the sense amp bitlines BL1B/BL1B', the PMOS transistors Q3 and Q4 compete in pulling up the sense amp terminals 112b and 112a, respectively, wherein the transistor current with the highest magnitude will pull up the corresponding terminal 112b/112a faster, thereby turning on a corresponding NMOS transistor Q6 or Q5. The sensed data is thus latched in the sense amp 112, wherein the voltage across the sense amp bitlines BL1B/BL1B' has a magnitude of about VDD, with a polarity determined by the sensed data from the FE memory cell 104a. The memory cell bitlines BL1A/BL1A' and the sense amp bitlines BL1B/BL1B' may then be disconnected by deactivating the TGS1 signal, whereafter the data may be transferred to local IO lines LIO/LIO' via transistors 120a and 120b using a signal LIOS.

The device 102 further comprises a data bitline select circuit 114 (FIG. 3), associated with the sense amp circuit 112, comprising a first pair of transistors Q7 and Q8, and a second pair of transistors Q9 and Q10. The exemplary data bitline select circuit 114 is connected to the complimentary data bitlines BL1A and BL1A' through transistors 116 and sense amp bitlines BL1B and BL1A', as well as to the terminals 112a and 112b of the sense amp 112. With the transistors 116a and 116b on during a read operation, the circuit 114 connects the first terminal 112a with the first bitline BL1A and the second terminal 112b with the second bitline BL1A' if the transistors Q9 and Q10 are activated by a first bitline select control signals BLS1. Conversely, where the transistors Q7 and Q8 are activated by a second bitline select signal BLS2, the circuit 114 connects the first sense amp terminal 112a with the second bitline BL1A' and the second terminal 112b with the first bitline BL1A.

The signals BLS1 and BLS2 may be provided by a control circuit during restore operations, so as to invert data being restored to the FE memory cells 104, to thereby mitigate or reduce the adverse effects of FE capacitor imprint. In addition, the circuit 114 may also be used to selectively invert data being provided by the sense amp 112 to local IO lines LIO/LIO' during a read operation, according to a toggle condition associated with the cells being read. Thus, for example, where the data in the cells 104 has been inverted during a restore portion of a prior read/restore operation, the data may be reinverted during a subsequent read operation, so as to provide the proper data to the IO lines LIO and LIO' using IO select transistors 120a and 120b according to the local IO select signal LIOS.

Where transistors 120 are on (e.g., LIOS high), the circuit 114 selectively connects the first sense amp terminal 112a with a first IO line LIO and the second terminal 112b with a second IO line LIO' (e.g., via actuation of transistors Q9 and Q10 using signal BLS1). Alternatively, the circuit 114 connects the first terminal 112a with the second IO line LIO' and the second terminal 112b with the first IO line LIO (e.g., via actuation of transistors Q7 and Q8 using signal BLS2). In the exemplary device 102, the signals BLS1 and BLS2 are controlled during at least a portion of the read operation according to a toggle condition associated with the data cell data bit read from the ferroelectric data cell 104. In this example, the signal BLS1 is activated when the cell data is stored in the cells 104 in a non-inverted state, and the signal BLS2 is activated when the cell data being read is stored in the cell 104 in an inverted state.

It is noted at this point that other forms of switching components may be used to selectively interconnect the sense amp terminals 112a and 112b, the bitlines BL1A and BL1A', and the IO lines LIO and LIO' to invert the data restored to the cells 104 during restore operations and to selectively invert data being read from the cells 104 during read operations within the scope of the invention. Moreover, other control circuits may be employed to provide the toggle signals BLS1 and BLS2 during read and restore operations in the device 102, wherein all such variations are contemplated as falling within the scope of the present invention.

Figure 4A:
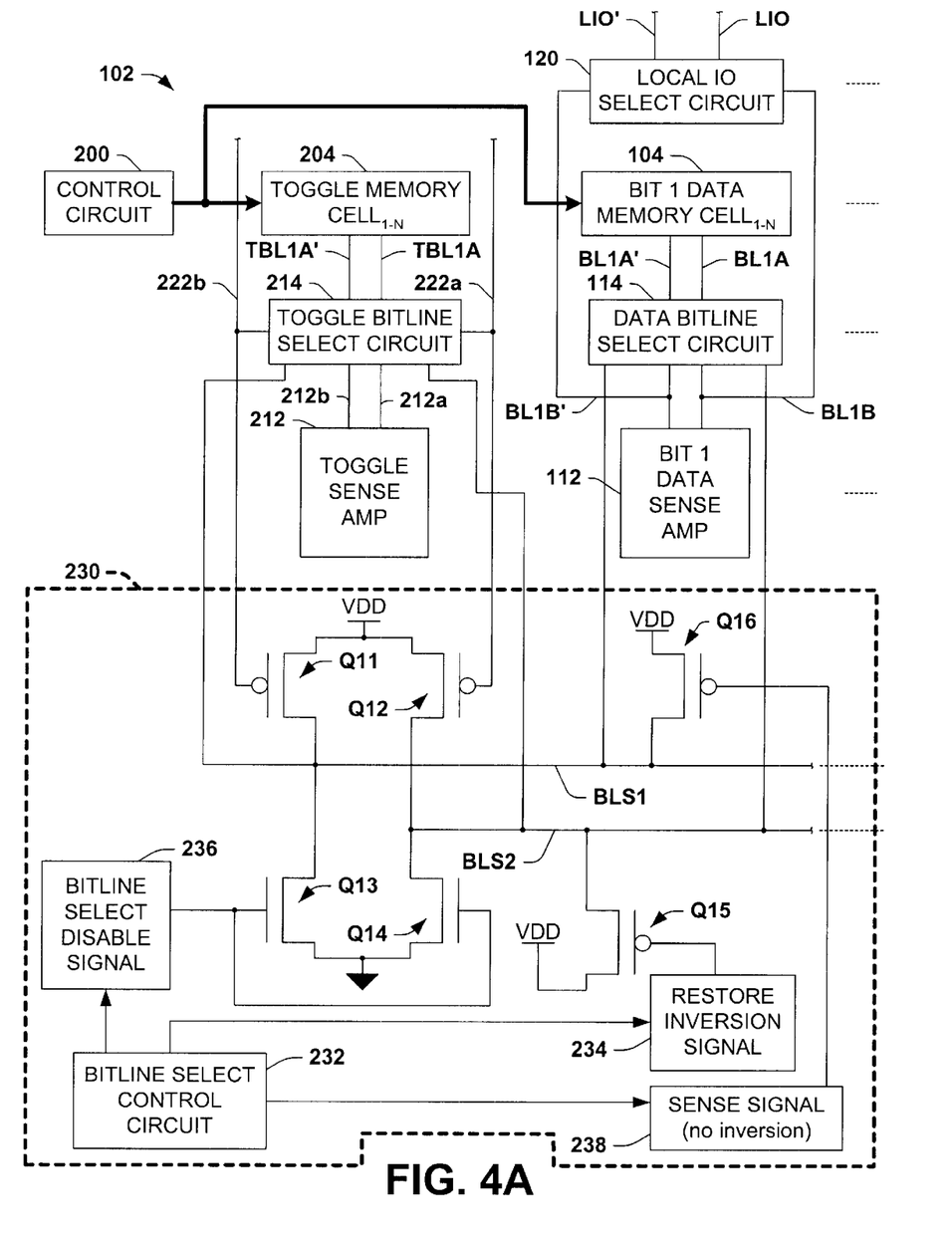
FIG. 4A is a schematic diagram illustrating an exemplary toggle data buffer circuit in the memory device of FIG. 2 in accordance with the invention.
Figure 5A:
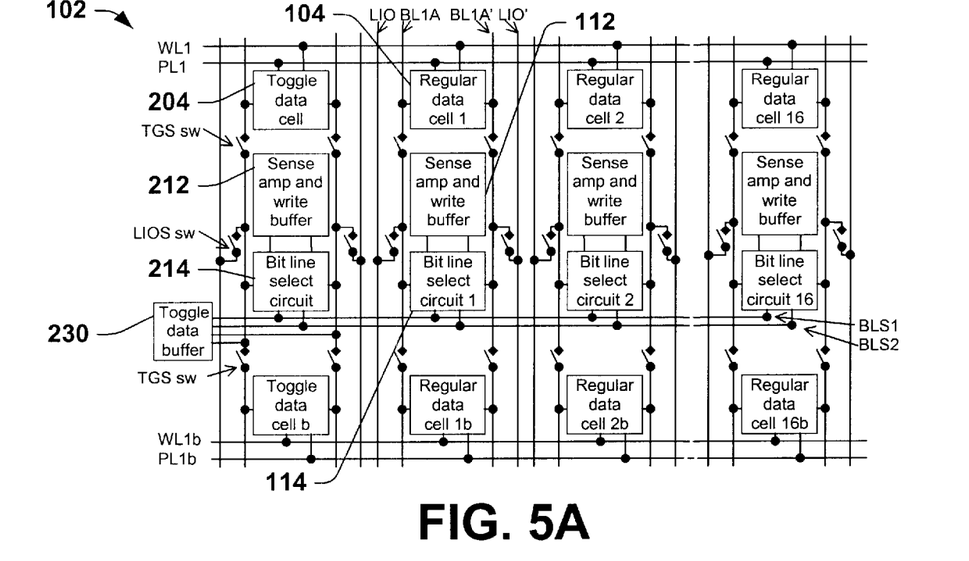
FIG. 5A is a schematic diagram illustrating a portion of the ferroelectric memory device of FIGS. 2–4A.

Referring also to FIGS. 4A and 5A, the exemplary ferroelectric memory device 102 further comprises a control circuit 200 providing wordline (WL), plateline (PL), dummy cell wordline (DWL), equalization (EQ, BLR), sector select (TGS), and other control signals to the data memory cells 104 and to a column of ferroelectric toggle memory cells 204. The toggle memory cells 204 are generally similar to the ferroelectric data memory cells 104, and are employed in the exemplary memory device 102 to indicate whether the data bits in corresponding data cells 104 are stored in inverted or non-inverted states. The memory device 102 may comprise any number M of columns forming data words, for example, such as 16, 32, or 64 memory cells 104 (bits) per data word, wherein each column comprises an integer number N such words. The toggle data memory 204 comprises one toggle data cell per data word, so as to indicate whether the corresponding N data cells 104 have inverted or non-inverted data bits stored therein. A toggle sense amp circuit 212 and a toggle bitline select circuit 214 are provided, which are similar to the data sense amp 112 and data bitline select circuit 114, respectively, described above.

The toggle sense amp circuit 212 comprises first and second terminals connectable to complimentary toggle bitlines TBL1A and TBL1A' to sense a differential voltage representative of a toggle data bit stored in a selected one of the toggle memory cells 204. Thus, in a read operation, the toggle cell 204 associated with a data word being read from the data cells 104 is selected, and the toggle data bit therein is sensed by the toggle sense amp 212. The sensed toggle data is buffered in the toggle sense amp 212 and provided to complimentary toggle lines 222a and 222b as a differential voltage by the toggle bitline select circuit 214.

During a read operation the toggle bitline select circuit 214 connects a first terminal 212a of the toggle sense amp 212 with the bitline TBL1A and a second terminal 212b with the bitline TBL1A'. At this sense portion of the read period, the signal BLS1 is high and the signal BLS2 is low. This causes the sense amp 212 to sense the state of the toggle data bit and to provide the toggle data bit to a toggle data buffer 230 via the lines 222a and 222b. As described in greater detail below, the toggle data buffer 230 provides control of the selective data inversion with respect to the data memory cells 104 during the read operation. In particular, the bitline select control signals BLS1 and BLS2 are derived from the sensed toggle data bit from the cell 204 during a portion of the read operation via the toggle data buffer 230.

Figure 5B:
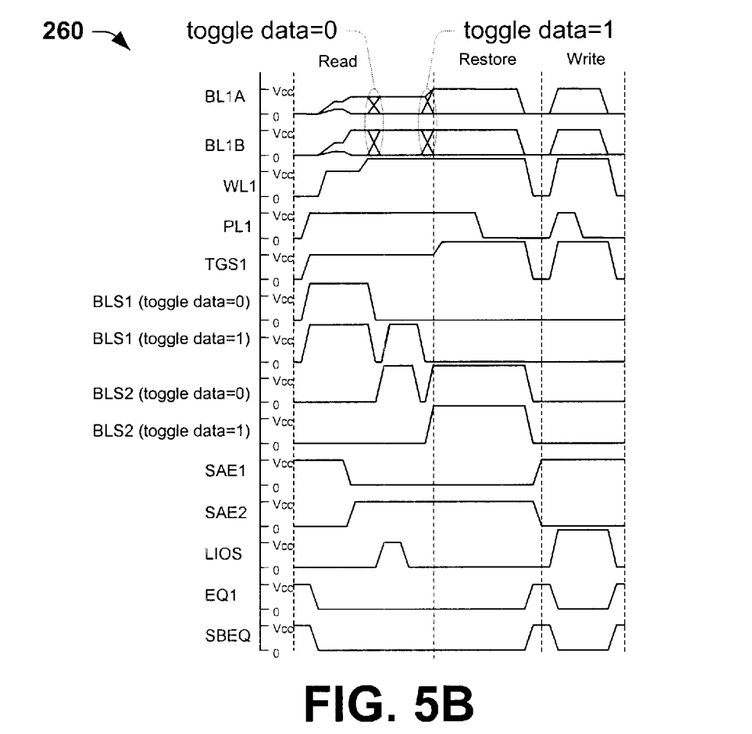
FIG. 5B is an exemplary timing diagram illustrating operation of the memory device of FIGS. 2–4A and 5A.

As illustrated in a timing diagram 260 of FIG. 5B, a read operation begins with precharging or equalization of the bitlines and BL1A/BL1A' and BL1B/BL1B' by the EQ1 and SBEQ signals (e.g., from the control circuit 200) becoming VDD to equalize the bitlines BL1A/BL1A' and BL1B/BL1B' to 0 volts. The sense amp 112 is then connected to the bitlines BL1A/BL1A' by the signals BLS1 and TGS1 becoming VDD (e.g., or a boosted level VDD+alpha). A bias is then applied to the data cell ferroelectric capacitor of interest (e.g., $C_{FE}1$) by PL1 becoming VDD. The signals EQ1 and SBEQ are then lowered to 0 volts, and the memory cell 104a is connected to the data bitline BL1A by the wordline WL1 and a reference voltage DCR is applied to the complimentary bitline BL1A' by DWL1–3 becoming VDD to establish a differential voltage across the data bitlines BL1A and BL1A'. At this point, the voltages on the bitlines BL1A and BL1A' (e.g., previously equalized to the bitline reference voltage BLR via the EQ1 signal) are separated through signal charge from the cell capacitor CFE1 and the dummy cell reference capacitor 108c. Up to this point, a control circuit 232 of the toggle data buffer 230 maintains BLS1 high and BLS2 low by providing a sense signal 238 to a transistor Q16. The sense amp 112 is then enabled by SAE1 becoming 0 volts and SAE2 becoming VDD. After completion of the sensing, a bitline select disable signal 236 enabled to activate transistors Q13 and Q14. BLS1 and BLS2 both become 0 volts to be ready for toggle data state transfer from lines 222b and 222a in the toggle column to BLS1 and BLS2, respectively. The sensed voltage from the data bit lines BL1A/BL1A' is then transferred to the local IO lines LIO/LIO' according to the toggle condition of the data by using the BLS1 and BLS2 bitline select signals.

This allows the status of the sensed toggle data bit from the toggle data cell 204 to control the selective inversion of data sensed by the data sense amp 112 by providing the signals BLS1/BLS2 in accordance therewith. The timing diagram 260 illustrates the signals BLS1 and BLS2 for the cases where the toggle data is "1" (no inversion) and "0" (inversion). Where no inversion is needed (e.g., toggle data bit is "1"), the bitline select signals BLS1 and BLS2 are maintained high and low (e.g., Q11 on, Q12 off), respectively, while the data is latched or transferred to the local IO lines LIO/LIO' by the signal LIOS becoming VDD. Where the toggle data bit is "0", the transistor Q11 is off and Q12 is on, asserting the signal BLS2 to reverse the connection between the data sense amp 112 and the local IO lines LIO/LIO'.

During a restore operation, the toggle bitline select circuit 214 connects the first terminal 212a with the second bitline TBL1A' and the second terminal 212b with the first toggle bitline TBL1A. This effectively reverses the polarity of the toggle data bit being restored to the cell 204 of interest. In similar fashion, the data bitline select circuits 114 also reverse the data bits being restored to the data memory cells 104 during restore operations, whereby the adverse effects of ferroelectric memory cell imprint may be mitigated. It is noted that the inversion of the restored toggle data bit provides an indication for subsequent read operations that the corresponding data word bits are stored in inverted fashion in the data cells 104. In the illustrated implementation, the bitline select signals BLS1 and BLS2 are controlled by the toggle data buffer circuit 230 via a restore inversion signal 234 and a transistor Q15 to activate BLS2 and deactivate BLS1, causing the data bitline select circuits 114 to reverse the data being restored to the data cells 104 and the toggle cell 204.

Figure 4B:
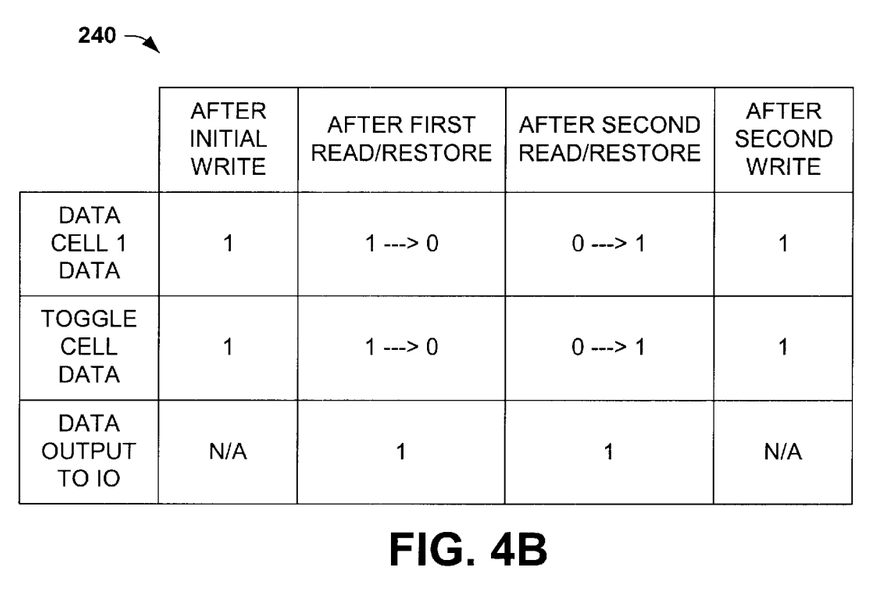
FIGS. 4B and 4C are state tables illustrating read, restore, and write operation of the memory device of FIGS. 2–4A.
Figure 4C:
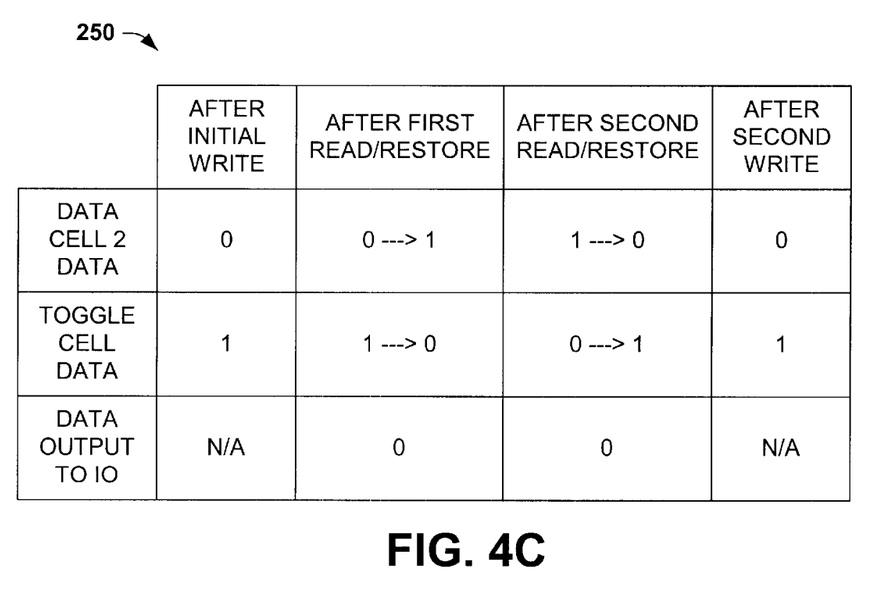

Referring also to FIGS. 4B and 4C, state tables 240 and 250 illustrate read, restore, and write operation of the memory device 102 for the cases where a data cell 104 is initially written with a binary "1" and a binary "0", respectively. In the exemplary device 102, a first state (e.g., binary "1") of a toggle data bit stored in the toggle memory cells 204 is representative of non-inverted data being stored in the corresponding data word (e.g., in cell 104), and a second state (e.g., "0") indicates inverted data being stored in the corresponding data word of cells 104. In this implementation, whenever a data word is written to the cells 104, the corresponding toggle data bit is set to a binary "1", thereby indicating that the data bits in the cells 104 are stored in non-inverted fashion.

A subsequent read operation causes the data to be provided to the local IO lines LIO and LIO' with no inversion, so as to provide the correct data that was written. In particular, the toggle data bit "1" state activates the bitline select signal BLS1 through activation of a transistor Q11 in the toggle data buffer 230 while the IO lines LIO/LIO' are connected via the LIOS signal. This, in turn, activates the transistors Q9 and Q10 in the data bitline select circuit 114 to connect the data bitline BL1A (e.g., and BL1B) with the first sense amp terminal 112a, and to connect the data bitline BL1A' (e.g., and BL1B') with the second sense amp terminal 112b. In this manner, the non-inverted data bit is transferred to the local IO lines LIO and LIO'.

In the associated restore operation, the data bits are inverted and stored in the inverted state to the data memory cells 104, and the corresponding toggle data bit is inverted (e.g., to a binary "0"). Thereafter, a subsequent read operation targeting the same data word will sense the corresponding toggle data bit state (e.g., binary "0"), indicating that the sensed data from the cells 104 is inverted. This toggle data bit state causes activation of the bitline select signal BLS2 through activation of a transistor Q12 in the toggle data buffer 230, which in turn activates the transistors Q7 and Q8 in the data bitline select circuit 114. This effectively cross couples the data bitline BL1A (e.g., and BL1B) with the second sense amp terminal 112b, and the data bitline BL1A' (e.g., and BL1B') with the first sense amp terminal 112a, thereby inverting the data sent to the local IO lines LIO and LIO'.

The exemplary toggle data buffer 230 of FIG. 4A is connected to the toggle sense amp 212 through the toggle bitline select circuit 214 and operates to provide the signal BLS1 or BLS2 to the data bitline select circuit 114 representative of the toggle data bit from the toggle cell 204 during the read operation. The switching components (e.g., Q7–Q10) of the circuit 114 make appropriate connections between the data bitlines BL1A/BL1A' (e.g., and the sense amp bitlines BL1B/BL1B') and the data sense amp circuit terminals 212a/212b according to the signal from the toggle data buffer 230 during a read operation. During a restore operation, a bitline select control circuit 232 of the toggle data buffer 230 provides a bitline select disable signal 236 to disassociate the bitline select signals BLS1 and BLS2 from the toggle bit via transistors Q13 and Q14, and provides a restore inversion signal 234 to a transistor Q15 to drive the BLS2 signal high, thereby causing an automatic inversion of restored data and toggle bits to the cells 104 and 204, respectively.

In this manner, the exemplary memory device 102 provides a read circuit connected to the data cells 104 and to the IO lines LIO/LIO', which selectively transfers the data from the cell 104 to the IO lines LIO/LIO' in a non-inverted state or in an inverted state according to a toggle signal BLS1/BLS2 from the toggle data buffer 230 during a read operation. This effectively rectifies any data inversion occurring previously, thus allowing data inversion during restore to mitigate cell imprint difficulties, while ensuring correct data provision to the IO lines LIO/LIO'. The device 102 also provides restore circuitry to transfer an inverted data bit to the data cell 104 and to transfer an inverted toggle data bit to the toggle cell 204 during a restore operation.

Figures 6, 7:
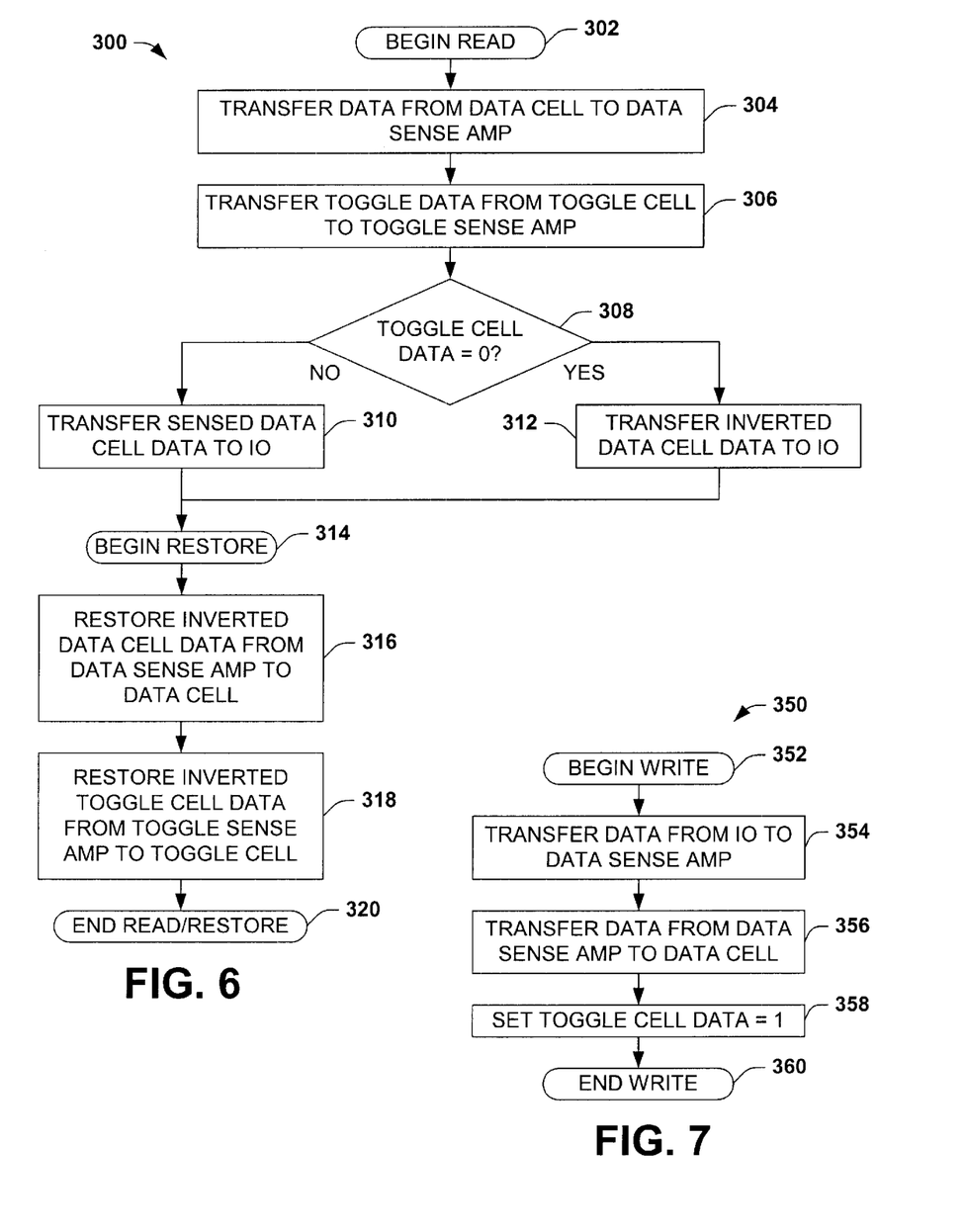
FIG. 6 is a flow diagram illustrating an exemplary method of reading and restoring data from a ferroelectric memory cell in accordance with another aspect of the invention.
FIG. 7 is a flow diagram illustrating an exemplary method of writing data to a ferroelectric memory cell in accordance with the invention.

Referring now to FIG. 6, another aspect of the invention provides techniques which may be employed for mitigating the adverse effects of cell imprint phenomena in the operation of ferroelectric memory devices. An exemplary method 300 is illustrated in FIG. 6 for reading data from a ferroelectric data memory cell in a memory device. Although the method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein as well as in association with other structures not illustrated.

Beginning at 302, data is transferred from a data cell to a data sense amp at 304 and toggle data is transferred from a toggle memory cell to a toggle sense amp at 306. The data is then selectively inverted before transfer to IO lines in accordance with the sensed toggle data. This provides the ability to invert restored data at 316 below, while ensuring proper data is provided to the IO lines at 310 and 312 below. At 308, a determination is made as to whether the toggle cell data is "0" (e.g., whether the sensed data from the data memory cell is inverted or not). If not (NO at 308), the sensed data is transferred to the IO lines at 310. Otherwise (YES at 308), the data is inverted and transferred to the IO lines at 312. Thereafter, a restore operation begins at 314. At 316, inverted data is restored from the data sense amp to the data cell, and inverted toggle data is restored to the toggle cell at 318, before the method 300 ends at 320. In the exemplary method 300, the inversion of restored data at 316 may advantageously reduce or mitigate imprint effects on ferroelectric memory cells. The selective inversion of sensed data at 308–312 accounts for the inversion, and ensures that the proper data is provided to the IO lines during read operations.

FIG. 7 illustrates an exemplary method 350 for writing data during a write operation in a ferroelectric memory device, which may be implemented in the exemplary memory device 102 and other devices in accordance with the invention. Beginning at 352, data is transferred from IO lines at 354 to a data sense amp, and thereafter to a data cell at 356. Alternatively, the data may be written directly from the IO lines to the data cell. At 358, a corresponding toggle data bit is set to "1" to indicate that the data written at 356 is not inverted, and the method ends at 360. This ensures that the toggle data bit is properly set for subsequent use in read restore operations employing the selective read inversion and restore inversion of the invention, such as in the method 300 of FIG. 6 described above.

Figure 8A:
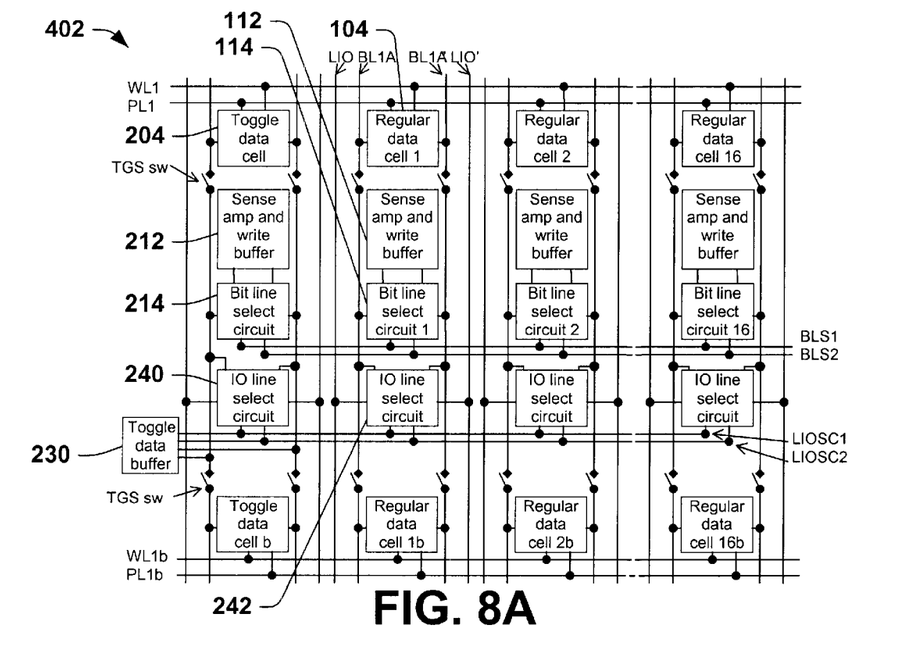
FIG. 8A is a schematic diagram illustrating a portion of another exemplary ferroelectric memory device in accordance with the present invention.
Figure 8B:
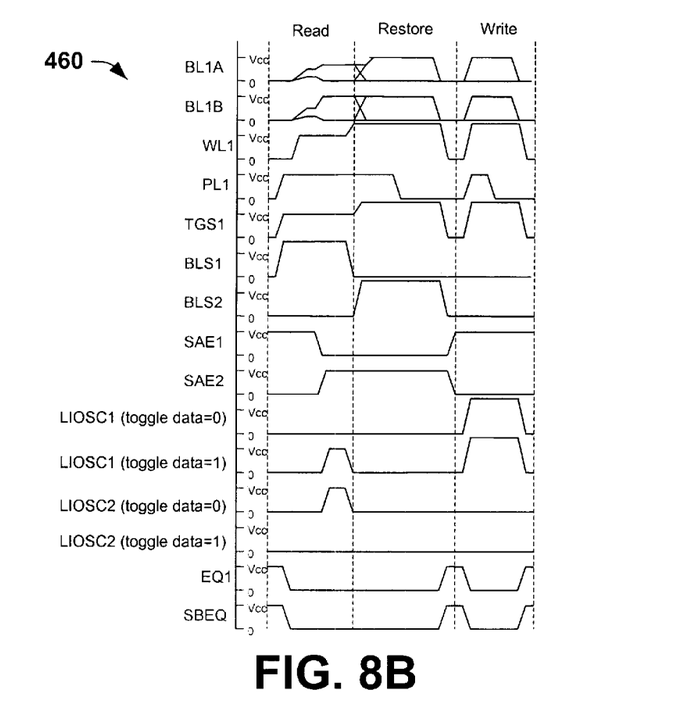
FIG. 8B is an exemplary timing diagram illustrating operation of the memory device of FIG. 8A.

FIGS. 8A and 8B illustrate a portion of another exemplary ferroelectric memory device 402 and a corresponding timing diagram 460, in accordance with another implementation of the invention. The device 402 comprises a toggle IO line select circuit 240 in a toggle memory column and data IO line select circuits 242 in data memory columns. Like the memory device 102 illustrated and described above, the device 402 employs bitline select circuits 114 and 214 in the data and toggle cell columns to invert or toggle data being restored to the cells 104,204, respectively. However, during read operations in the device 402, IO select circuits 242 operate to perform selective inversion of data being transferred to the local IO lines LIO and LIO', according to local IO select control signals LIOSC1 and LIOSC2.

During a read operation, the toggle data cell 204 is connected to the toggle sense amp 212 via the toggle bitline select circuit 214, and a toggle data bit from the cell 204 is sensed by the toggle sense amp 212. The toggle IO select circuit 240 provides the toggle bit data to the toggle data buffer 230, which provides the control signals LIOSC1/LIOSC2 in accordance therewith. The data from the data memory cells 104 is also sensed, wherein the data bitline select circuits 114 connect the terminals of the data sense amps 112 with the cells 104. The sense amps 112 then sense the data cell data and the IO line select circuits 242 connect the sense amp terminals to the IO lines LIO/LIO' in inverted or non-inverted fashion according to the signals LIOSC1/LIOSC2.

Thus, whereas the bitline select circuits 214 in the device 102 of FIGS. 2–5 performs selective inversion during read operations between the memory cells 104 and the IO lines LIO/LIO', the implementation of FIGS. 8A and 8B provides selective inversion of data cell data between the sense amps 112 and the IO lines LIO/LIO' using the data IO line select circuits 242. In this regard, the invention contemplates memory devices and methods for operation thereof in which the selective data inversion occurs at any point in the read operation to provide selectively inverted data to the local IO lines LIO/LIO', with non-selective (e.g., automatic) inversion during restore operations, and such alternate implementations are contemplated as falling within the scope of the appended claims.

Figure 9A:
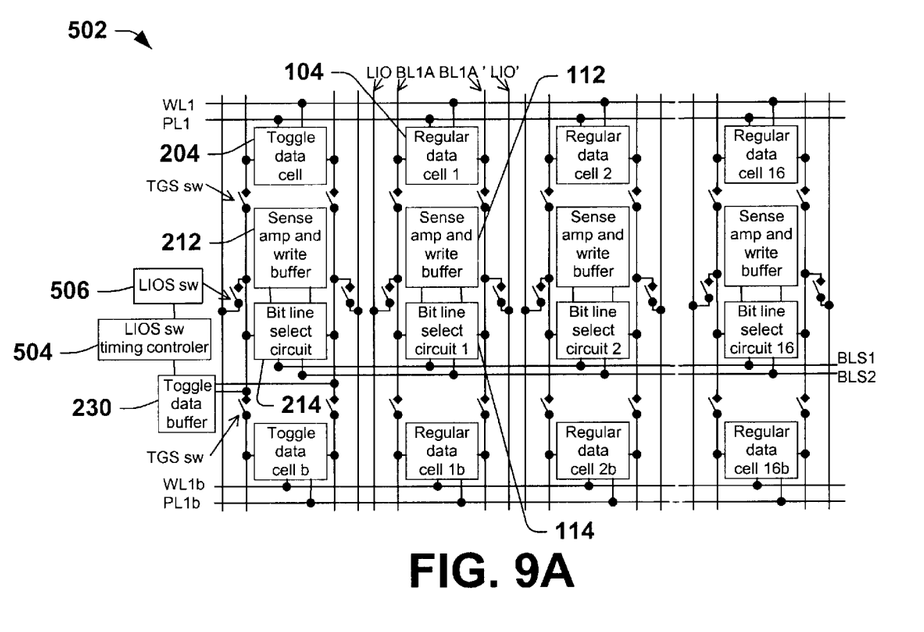
FIG. 9A is a schematic diagram illustrating a portion of another exemplary ferroelectric memory device in accordance with the present invention.
Figure 9B:
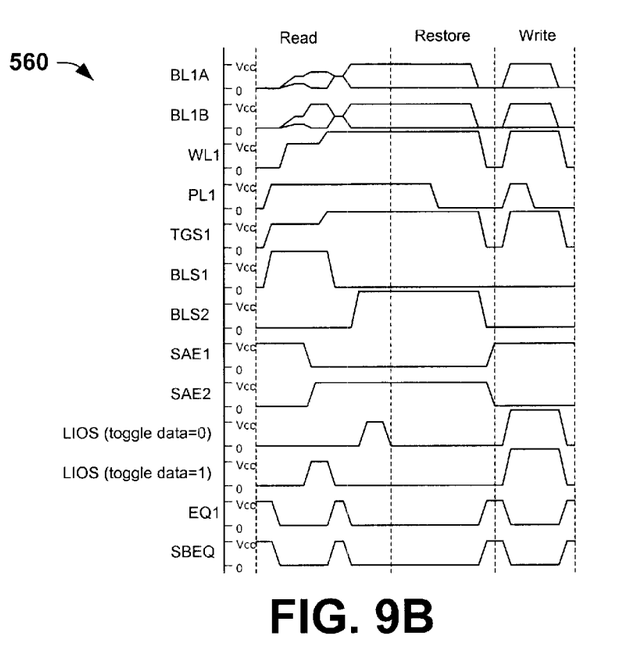
FIG. 9B is an exemplary timing diagram illustrating operation of the memory device of FIG. 9A.
Figure 9C:
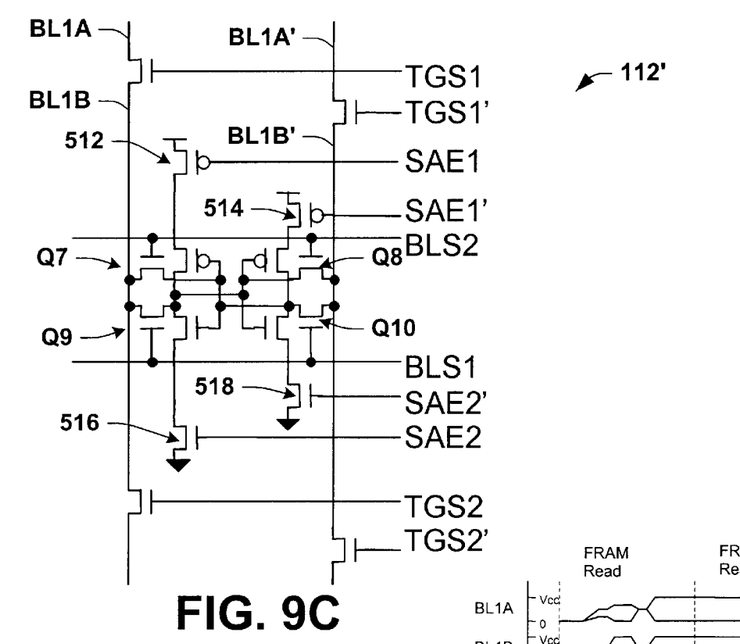
FIG. 9C is a schematic diagram illustrating another exemplary sense amp and data bitline select circuit which may be employed in the memory device of FIG. 9A in accordance with the invention.
Figure 9D:
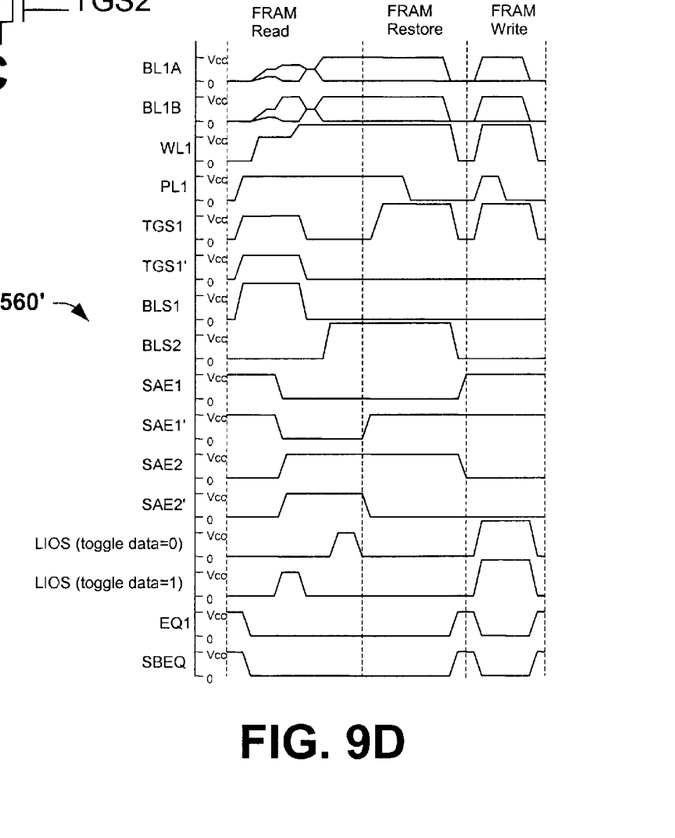
FIG. 9D is an exemplary timing diagram illustrating operation of the memory device of FIG. 9A with the sense amp and data bitline select circuit of FIG. 9C.
Figure 9E:
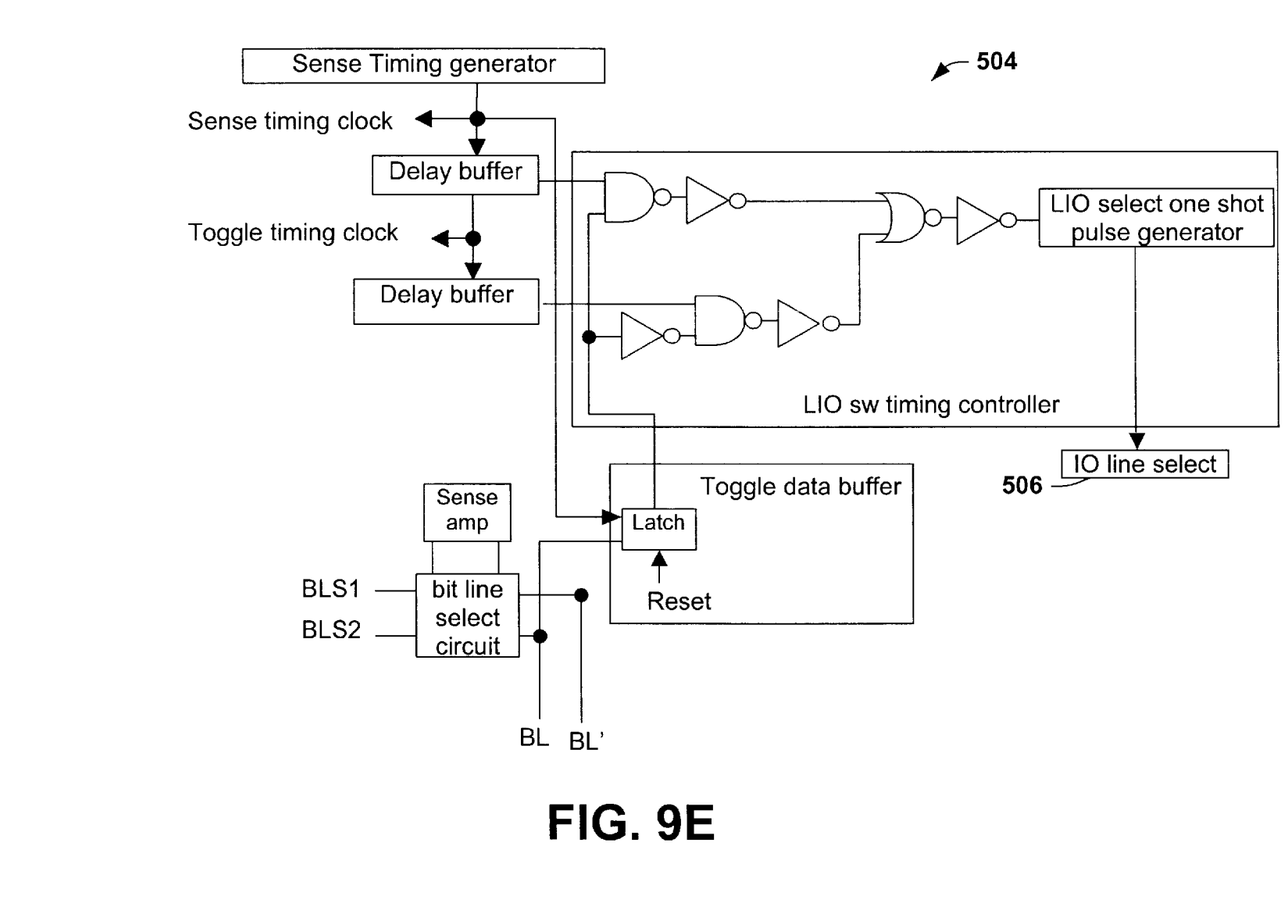
FIG. 9E is a schematic diagram illustrating an exemplary local IO switch timing control circuit for the memory device of FIG. 9A.

Another exemplary implementation of the invention is illustrated in FIGS. 9A, 9B, and 9E, wherein FIG. 9A illustrates another exemplary ferroelectric memory device 502, and FIG. 9B illustrates a corresponding timing diagram 560. In the device 502, the timing of a local IO select switching signal (LIOS sw) 506 is adjusted via a local IO switch timing control circuit 504, in order to achieve selective inversion of data during a read operation according to the toggle data transferred to the toggle data buffer 230. In this implementation, the toggle data buffer 230 provides a signal to control the operation of the local IO switch timing control circuit 504.

As illustrated in FIG. 9B, the circuit 504 selectively provides a high-going local IO select switch signal 506 pulse either before or after transition of the data bitline select signals BLS1 and BLS2 during the read operation. Thus, in the case where the toggle data is "1" (e.g., no read operation inversion), the LIOS signal 506 is pulsed high by the circuit 504 while BLS1 is high and BLS2 is low, thus providing non-inverted data from the data sense amps 112 to the local IO lines LIO and LIO'. Conversely, where the toggle data is "0" (e.g., read inversion required), the circuit 504 pulses the signal 506 high after BLS1 has gone low and BLS2 has gone high, thereby providing inverted data from the data sense amps 112 to the local IO lines LIO and LIO'. FIG. 9C illustrates an alternate data sense amp circuit 112', which may be employed in the ferroelectric memory device 502 in accordance with the present invention. A timing diagram 560' illustrates the operation of this alternative implementation in FIG. 9D, in which the local IO switching control signal LIOS is selectively delayed according to the toggle data bit to achieve selective data inversion in providing the data to the IO lines LIO/LIO'.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A memory device, comprising:
   a ferroelectric data cell connected to one of first and second complimentary data bitlines, the ferroelectric data cell comprising a ferroelectric capacitor and a MOS transistor operable to selectively connect the ferroelectric capacitor between a plateline and one of the complimentary data bitlines according to a corresponding wordline, the ferroelectric data cell being operable to store a data cell data bit associated with a corresponding data word;
   a data sense amp circuit comprising first and second terminals, the data sense amp circuit being operable to sense a differential voltage at the first and second terminals; and
   a data bitline select circuit connected to the complimentary data bitlines and to the data sense amp, the data bitline select circuit being operable to connect the first terminal with the first complimentary bitline and the second terminal with the second complimentary bitline during a read operation and to connect the first terminal with the second complimentary bitline and the second terminal with the first complimentary bitline during a restore operation.

2. The memory device of claim 1, wherein the data bitline select circuit is further selectively operable to connect the first terminal with a first IO line and the second terminal with a second IO line or to connect the first terminal with the second IO line and the second terminal with the first IO line during the read operation according to a toggle condition associated with the data cell data bit read from the ferroelectric data cell.

3. The memory device of claim 2, wherein the data bitline select circuit comprises at least one switching component operable to selectively connect one of the first and second complimentary data bitlines to one of the first and second terminals and to connect another of the first and second complimentary data bitlines to another of the first and second terminals according to a toggle data bit representative of a toggle condition associated with data bits in the corresponding data word.

4. The memory device of claim 3, wherein the at least one switching component connects the first complimentary data bitline to the first terminal and connects the second complimentary data bitline to the second terminal during the read operation when the toggle data bit is in a first state and wherein the at least one switching component connects the first complimentary data bitline to the second terminal and connects the second complimentary data bitline to the first terminal during the read operation when the toggle data bit is in a second state.

5. The memory device of claim 4, wherein the first state of the toggle data bit is representative of non-inverted data being stored in the corresponding data word and wherein the second state of the toggle data bit is representative of inverted data being stored in the corresponding data word.

6. The memory device of claim 4, further comprising a ferroelectric toggle cell connected to one of a pair of complimentary toggle bitlines, the toggle memory cell comprising a ferroelectric capacitor and a MOS transistor operable to selectively connect the ferroelectric capacitor between a plateline and one of the complimentary toggle bitlines according to the corresponding wordline, the toggle memory cell being individually operable to store the toggle data bit representative of the toggle condition associated with data bits in the corresponding data word.

7. The memory device of claim 6, further comprising a toggle sense amp circuit comprising first and second terminals connectable to the complimentary toggle bitlines, the toggle sense amp being operable to sense a differential voltage across the complimentary toggle bitlines representative of the toggle data bit.

8. The memory device of claim 7, further comprising a toggle data buffer connected to the toggle sense amp and operable to provide a signal to the data bitline select circuit representative of the toggle data bit during the read operation, wherein the at least one switching component of the data bitline select circuit is operable to selectively connect one of the first and second complimentary data bitlines to one of the first and second terminals of the data sense amp circuit and to connect another of the first and second complimentary data bitlines to another of the first and second terminals of the data sense amp circuit according to the signal from the toggle data buffer.

9. The memory device of claim 8, further comprising a toggle bitline select circuit connected to the complimentary toggle bitlines and to the toggle sense amp circuit, the toggle bitline select circuit being operable to connect the first terminal of the toggle sense amp circuit with the first complimentary toggle bitline and the second terminal of the toggle sense amp circuit with the second complimentary toggle bitline during a read operation and to connect the first terminal of the toggle sense amp circuit with the second complimentary toggle bitline and the second terminal of the toggle sense amp circuit with the first complimentary toggle bitline during a restore operation.

10. The memory device of claim 8, further comprising an IO line select circuit connected to the first and second complimentary data bitlines and to first and second IO lines in the memory device, the IO line select circuit being selectively operable to connect the first complimentary data bitline with the first IO line and the second complimentary data bitline with the second IO line or to connect the first complimentary data bitline with the second IO line and the second complimentary data bitline with the first IO line during the read operation according to the signal from the toggle data buffer.

11. The memory device of claim 1, further comprising an IO line select circuit connected to the first and second complimentary bitlines and to first and second IO lines in the memory device, the IO line select circuit being selectively operable to connect the first complimentary bitline with a first IO line and the second complimentary bitline with a second IO line or to connect the first complimentary bitline with the second IO line and the second complimentary bitline with the first IO line during the read operation according to a toggle condition associated with the data cell data bit read from the ferroelectric data cell.

12. A memory device, comprising:
a data cell operable to store a data bit associated with a data word;
a toggle cell operable to store a toggle data bit representative of a toggle condition associated with data bits in the data word;
a toggle data buffer connected to the toggle cell, the toggle data buffer providing a toggle signal representative of the toggle data bit during a read operation;
a read circuit connected to the data cell and to first and second IO lines, the read circuit being operable to selectively transfer the data bit from the data cell to the IO lines in a non inverted state or in an inverted state according to the toggle signal during a read operation; and
a restore circuit connected to the data cell and to the toggle cell, the restore circuit being operable to transfer an inverted data bit to the data cell and to transfer an inverted toggle data bit to the toggle cell during a restore operation.

13. The memory device of claim 12, wherein the read circuit comprises:
a data sense amp comprising first and second terminals, the data sense amp being operable to sense a differential voltage associated with the data cell; and
a data bitline select circuit connected to the data sense amp, the data bitline select circuit being selectively operable to connect the first terminal of the data sense amp with the first IO line and the second terminal of the data sense amp with the second IO line or to connect the first terminal with the second IO line and the second terminal with the first IO line during the read operation according to the toggle signal during the read operation.

14. The memory device of claim 13, wherein the restore circuit comprises a bitline select control circuit providing a restore inversion signal during the restore operation, wherein the data bitline select circuit is operable to transfer an inverted data bit to the data cell according to the restore inversion signal.

15. The memory device of claim 12, further comprising a data sense amp comprising first and second terminals, the data sense amp being operable to sense a differential voltage associated with the data cell;
wherein the read circuit comprises an IO line select circuit connected to the data sense amp, the IO line select circuit being selectively operable to connect the first terminal of the data sense amp with the first IO line and the second terminal of the data sense amp with the second IO line or to connect the first terminal with the second IO line and the second terminal with the first IO line during the read operation according to the toggle signal.

16. The memory device of claim 15, wherein the restore circuit comprises:
   a bitline select control circuit providing a restore inversion signal during the restore operation, wherein the data bitline select circuit is operable to transfer an inverted data bit to the data cell according to the restore inversion signal;
   a data bitline select circuit connected to data cell, the data bitline select circuit being operable to transfer an inverted data bit to the data cell during the restore operation; and
   a toggle bitline select circuit connected to the toggle cell, the toggle bitline select circuit being operable to transfer an inverted toggle data bit to the toggle cell during the restore operation.

17. A method of reading data from a ferroelectric data memory cell in a memory device, the method comprising:
   sensing a data bit from a data memory cell;
   sensing a toggle bit from a toggle memory cell;
   selectively inverting the data bit sensed from the data memory cell according to the sensed toggle bit before the sensed data bit is provided to IO lines; and
   transferring the data bit to an IO line.

18. The method of claim 17, further comprising:
   inverting the data bit and transferring the inverted data bit to the data memory cell during a restore operation; and
   inverting the toggle bit and transferring the inverted data bit to the data memory cell during a restore operation.

19. The method of claim 18, wherein selectively inverting the data bit comprises:
   determining whether the toggle data bit indicates non-inverted data is stored in the data memory cell;
   connecting a first data sense amp terminal to a first IO line and a second data sense amp terminal to a second IO line if the toggle bit indicates that non-inverted data is stored in the data memory cell; and
   connecting the first data sense amp terminal to the second IO line and the second data sense amp terminal to the first IO line if the toggle bit indicates that inverted data is stored in the data memory cell.

20. The method of claim 17, wherein selectively inverting the data bit comprises:
   determining whether the toggle data bit indicates non-inverted data is stored in the data memory cell;
   connecting a first data sense amp terminal to a first IO line and a second data sense amp terminal to a second IO line if the toggle bit indicates that non-inverted data is stored in the data memory cell; and
   connecting the first data sense amp terminal to the second IO line and the second data sense amp terminal to the first IO line if the toggle bit indicates that inverted data is stored in the data memory cell.

* * * * *